United States Patent
Mittleman et al.

(10) Patent No.: US 9,664,569 B2
(45) Date of Patent: May 30, 2017

(54) CIRCUIT BOARD CONFIGURATIONS FACILITATING OPERATION OF HEAT SENSITIVE SENSOR COMPONENTS

(71) Applicant: Google Inc., Mountain View, CA (US)

(72) Inventors: Adam Mittleman, Redwood City, CA (US); Ian Charles Smith, Mountain View, CA (US); Daniel Adam Warren, San Francisco, CA (US); William Raeming Dong, Palo Alto, CA (US); Jeff Wheeler, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/714,005

(22) Filed: May 15, 2015

(65) Prior Publication Data
US 2016/0334279 A1    Nov. 17, 2016

(51) Int. Cl.
| | | |
|---|---|---|
| *G01N 21/00* | (2006.01) | |
| *G01J 5/06* | (2006.01) | |
| *H05K 1/02* | (2006.01) | |
| *G01J 5/00* | (2006.01) | |
| *G01J 5/10* | (2006.01) | |
| *G01J 5/02* | (2006.01) | |
| *G01J 5/04* | (2006.01) | |
| *G08B 13/189* | (2006.01) | |

(52) U.S. Cl.
CPC ............. *G01J 5/06* (2013.01); *G01J 5/0014* (2013.01); *G01J 5/0205* (2013.01); *G01J 5/04* (2013.01); *G01J 5/10* (2013.01); *G08B 13/189* (2013.01); *H05K 1/0298* (2013.01)

(58) Field of Classification Search
CPC ... H05K 1/0298; H05K 1/0201; H05K 1/0207
USPC ............. 250/338.5; 361/705, 707, 729, 759
See application file for complete search history.

(56) References Cited

U.S. PATENT DOCUMENTS

| | | | |
|---|---|---|---|
| 8,847,772 B2 | 9/2014 | Marks et al. | |
| 8,913,390 B2 * | 12/2014 | Malek | H05K 7/205 165/104.33 |
| 9,232,640 B2 * | 1/2016 | Zhang | H05K 1/0298 |
| 2009/0301765 A1 * | 12/2009 | Strauss | H05K 1/0207 174/252 |
| 2012/0293963 A1 * | 11/2012 | Slaton | H05K 1/0206 361/720 |
| 2013/0322022 A1 * | 12/2013 | Wu | H05K 7/20445 361/720 |

\* cited by examiner

*Primary Examiner* — David Porta
*Assistant Examiner* — Meenakshi Sahu
(74) *Attorney, Agent, or Firm* — Kilpatrick Townsend & Stockton LLP

(57) ABSTRACT

A multilayered circuit board having a metal-free region vertically extending through at least a portion of a conductive layer, which lies generally parallel to a horizontal plane, vertically spaced from an outer surface. Heat-emitting and heat-sensitive components are mounted on the outer surface. The heat-emitting component is vertically and laterally spaced from the metal-free region, whereas the heat-sensitive component is vertically spaced and laterally aligned within the metal-free region such that the metal-free region is a thermal barrier that shields heat-sensitive component from radial heat flowing from the heat-emitting component.

20 Claims, 9 Drawing Sheets

CIRCUIT BOARD CONFIGURATIONS FACILITATING OPERATION OF HEAT SENSITIVE SENSOR COMPONENTS

BACKGROUND OF THE INVENTION

Passive infrared (PIR) sensors are commonly used for people detection in burglar alarms, automatic lights, etc. They work by detecting temperature changes that occur when a person moves into range. For example, some include a pyroelectric transducer that outputs a signal when a temperature gradient is applied across its opposite ends. Such a gradient is created when infrared (IR) radiation emitted from a moving person strikes and transfers heat to one end of the transducer before the other.

PIR sensors are sometimes mounted on a printed circuit board (PCB), proximate heat-emitting electrical components, such as lights. Heat emitted from these nearby electric components may cause temperature gradients similar to those caused by people, resulting in false detection. Continuous exposure to this energy may saturate the transducer, rendering it incapable of detection altogether.

BRIEF SUMMARY OF THE INVENTION

In some embodiments, a thermal-isolation assembly includes a multilayer circuit board. The multilayer circuit board including: first and second outer surfaces being spaced along a vertical axis, each of the first and second outer surfaces lying generally parallel to a horizontal plane, the first outer surface facing a first direction generally parallel to the vertical axis, the second outer surface facing a second, opposite direction; first and second outer conductive layers being spaced along the vertical axis between the first and second outer surfaces, each of the first and second outer conductive layers lying generally parallel to the horizontal plane; first and second dielectric layers being spaced along the vertical axis between the first and second outer conductive layers, each of the first and second dielectric layers lying generally parallel to the horizontal plane; first and second inner conductive layers being spaced along the vertical axis between the first and second dielectric layers, each of the first and second inner conductive layers lying generally parallel to the horizontal plane; a middle dielectric layer being located along the vertical axis between the first and second inner conductive layers, the middle dielectric layer lying generally parallel to the horizontal plane; a metal-free region extending along the vertical axis through at least a portion of the first outer conductive layer, the metal-free region having an outer periphery along the horizontal plane; a heat-emitting component being mounted at a first mounting location on the first outer surface, the heat-emitting component and the metal-free region being spaced along the vertical axis and the horizontal plane, the heat-emitting component being electrically coupled to the first outer and the first inner conductive layers; and a heat-sensitive component being mounted at a second mounting location on the first outer surface, the heat-sensitive component and the metal-free region being spaced along the vertical axis and generally aligned along the horizontal plane, the heat-sensitive component being electrically coupled to the second outer and the second inner conductive layers. The middle dielectric layer thermally isolates the heat-sensitive component by resisting heat flow from the first to the second inner and outer conductive layers, thereby limiting return heat flow to the heat-sensitive component, and the metal-free region thermally isolates the heat-sensitive component by resisting heat flow generally parallel to the horizontal plane towards the heat-sensitive component. In some embodiments, the metal-free region is free of metal ground planes but includes metal ground, power, or signal traces.

In some embodiments, a multilayered circuit board is disclosed as comprising: a first conductive layer lying generally parallel to a horizontal plane; a metal-free region extending along a vertical axis through at least a portion of the first conductive layer; and a first outer surface being located along the vertical axis above the first conductive layer, lying generally parallel to the horizontal plane, and supporting a heat-emitting component and a heat-sensitive component, the heat-emitting component and the metal-free region being spaced along the vertical axis and the horizontal plane, the heat-sensitive component and the metal-free region being spaced along the vertical axis and generally aligned along the horizontal plane. The metal-free region thermally isolates the heat-sensitive component by resisting heat flowing generally parallel to the horizontal plane towards the heat-sensitive component.

In some embodiments, the metal-free region includes inner and outer peripheries, and the heat-sensitive component is aligned along the horizontal plane inside the inner periphery such that the metal-free region provides a thermal-isolation barrier along the horizontal plane between the heat-sensitive and heat-emitting components. In some embodiments, the multilayered circuit board further comprises a second conductive layer being located along the vertical axis below the first conductive layer and lying generally parallel to the horizontal plane; and a second metal-free region extending along the vertical axis through at least a portion of the second conductive layer, the first and second metal-free regions being spaced along the vertical axis and the horizontal plane, the first and second metal-free regions being spaced along the vertical axis and generally aligned along the horizontal plane. In some embodiments, the multilayered circuit board further comprises a first connector extending generally parallel to the vertical axis and electrically coupling the heat-emitting component to the first conductive layer, a second connector extending generally parallel to the vertical axis and electrically coupling the heat-sensitive component to the second conductive layer, and a middle dielectric layer being located along the vertical axis between the first and second conductive layers and thermally resisting heat flow from the first conductive layer to the second conductive layer, thereby limiting return heat flow through the second connector to the heat-sensitive component.

In some embodiments, the metal-free region is free of metal ground planes but includes metal ground, power, or signal traces. In some embodiments, the multilayer circuit board further comprises a plurality of through holes extending along the vertical axis through the metal-free region and being spaced around the heat-sensitive component, wherein the through holes resist heat flow generally parallel to the horizontal plane towards the heat-sensitive component. In some embodiments, the multilayer circuit board further comprises a plurality of metal-plated vias extending along the vertical axis and being located outside the metal-free region, wherein the metal-plated vias provide thermal paths away from the heat-sensitive component. In some embodiments, the multiplayer circuit board further comprises a silicon rubber sleeve fitted around a portion of the heat-sensitive component that projects away from the first outer surface, the silicon rubber sleeve thermally isolates the heat-sensitive component by resisting heat transfer by radiation to the heat-sensitive component. In some embodiments, the heat-emitting component is an LED and the heat-sensitive component is a PIR sensor. In some embodiments, the multilayer circuit board is part of a hazard detector.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A circuit board design for thermally isolating heat-sensitive components from nearby heat-emitting components can lead to new product design and functionality by enabling smaller circuit boards, more closely arranged components on individual circuit boards, circuit boards installed in smaller or higher-temperature spaces, etc. In some embodiments, a combined smoke detector and carbon monoxide device includes a PIR sensor and plurality of lights closely spaced on a circuit board designed to thermally isolate the PIR sensor from heat emitted by the lights, thereby enabling an attractive, compact design having motion-detection and lighting functionality.

Figure 1A:
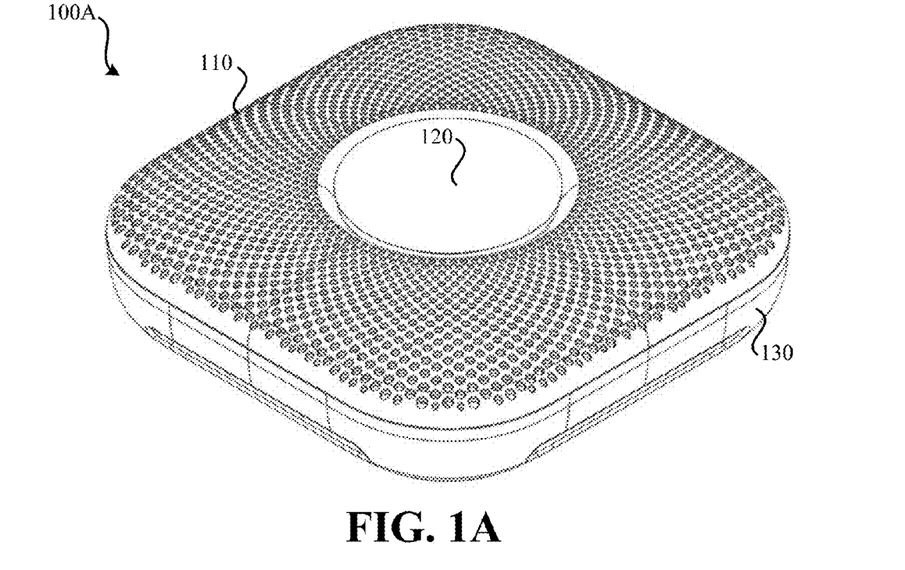
FIGS. 1A and 1B illustrate an embodiment of a smart combined smoke detector and carbon monoxide device.

Various embodiments of thermal measures, including the above aspects and aspects yet to be noted, are described in detail in relation to the figures that follow. For overall understanding, a big picture view of a device that uses such thermal measure is first described. Such a device may be a dedicated smoke detector or a combination device, such as carbon-monoxide detector and smoke detector. FIG. 1A illustrates an embodiment of a smart combined smoke detector and carbon monoxide device 100A. Such an embodiment of a smart combined smoke detector and carbon monoxide device 100A may be suitable for mounting to a wall or ceiling in a room (or other location) within a structure in which smoke and/or carbon monoxide is to be monitored. Device 100A may be "smart," meaning the device 100A can communicate, likely wirelessly, with one or more other devices or networks. For instance, device 100A may communicate with a remote server via the Internet and, possibly, a home wireless network (e.g., an IEEE 802.11a/b/g network, 802.15 network, such as using the Zigbee® or Z-Wave® specification). Such a smart device may allow for a user to interact with the device via wireless communication, either via a direct or network connection between a computerized device (e.g., cellular phone, tablet computer, laptop computer, or desktop computer) and the smart device.

FIG. 1A illustrates an angular top projection view of combined smoke detector and carbon monoxide device 100A. Device 100A may generally be square or rectangular and have rounded corners. Visible in the angular top projection view are various components of the combined smoke detector and carbon monoxide device 100A, including: cosmetic grille 110, lens/button 120, and enclosure 130. Cosmetic grille 110 may serve to allow air to enter combined smoke detector and carbon monoxide device 100A through many holes while giving device 100A a pleasing aesthetic appearance. Cosmetic grille 110 may further serve to reflect light into the external environment of device 100A from internal light sources (e.g., LEDs). Light may be routed internally to cosmetic grille 110 by a light pipe, noted in relation to FIGS. 2A and 2C. It should be understood that the arrangement of holes and shape of cosmetic grille 110 may be varied by embodiment. Lens/button 120 may serve multiple purposes. First, lens/button 120 may function as a lens, such as a Fresnel lens, for use by a sensor, such as an infrared (IR) sensor, located within device 100A behind lens/button 120 for viewing the external environment of device 100A. Additionally, lens/button 120 may be actuated by a user by pushing lens/button 120. Such actuation may serve as user input to device 100A. Enclosure 130 may serve as a housing for at least some of the components of device 100A.

Figure 1B:
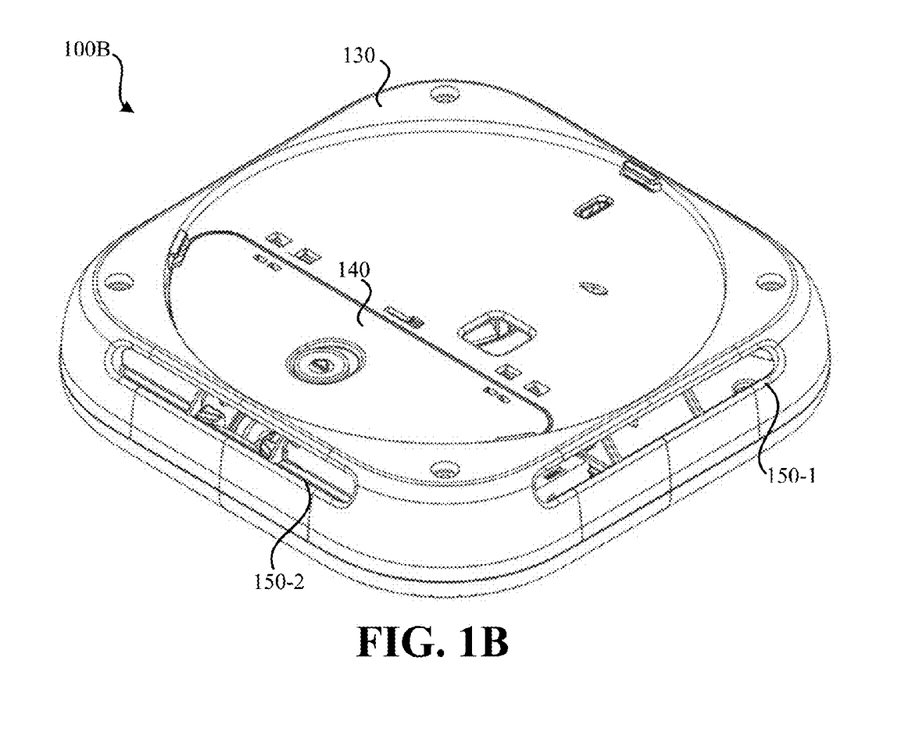

FIG. 1B illustrates an angular bottom projection view of a smart combined smoke detector and carbon monoxide device 100B. It should be understood that device 100A and device 100B may be the same device viewed from different angles. Visible from this view is a portion of enclosure 130. On enclosure 130, battery compartment door 140 is present through which a battery compartment is accessible. Also visible are airflow vents 150-1 and 150-2, which allow air to pass through enclosure 130 and enter the smoke chamber of device 100B.

Figure 2A:
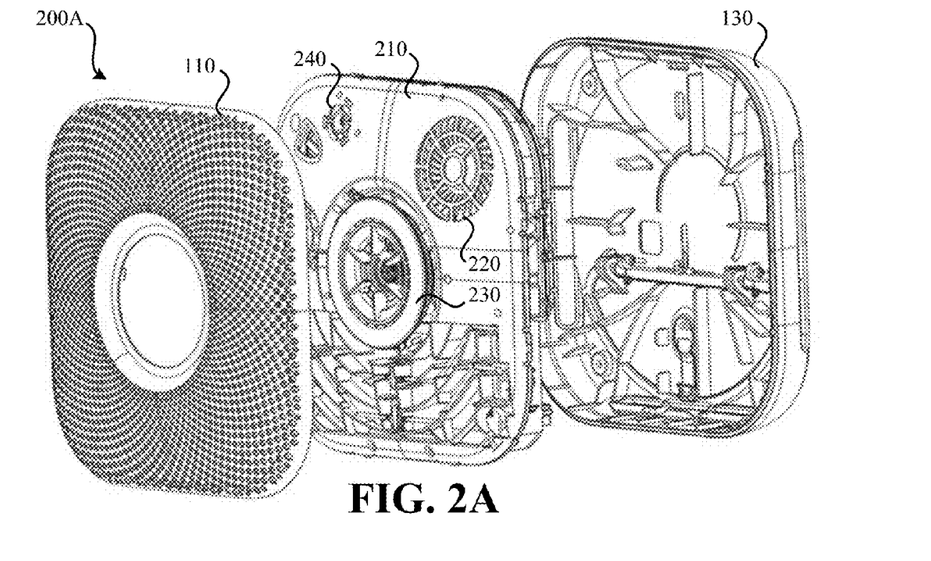
FIGS. 2A, 2B, 2C, and 2D illustrate an embodiment of an exploded smart combined smoke detector and carbon monoxide device.
Figure 2B:
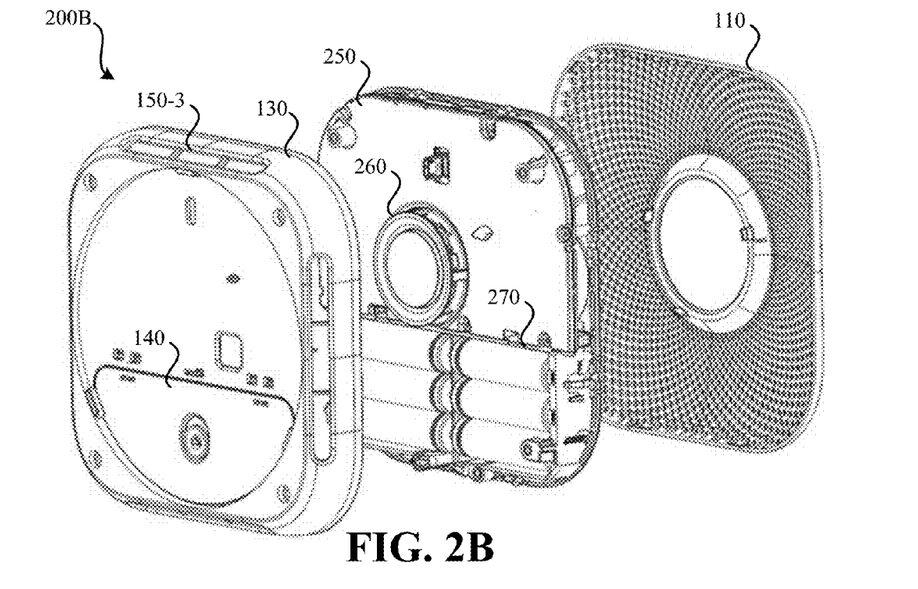

FIGS. 2A, 2B, 2C, and 2D illustrate an embodiment of an exploded smart combined smoke detector and carbon monoxide device. The devices of FIGS. 2A-2D can be understood as representing various views of devices 100A and 100B of FIGS. 1A and 1B, respectively. In FIG. 2A, device 200A is shown having cosmetic grille 110 and enclosure 130, which together house main chassis 210. Main chassis 210 may house various components that can be present in various embodiments of device 200A, including speaker 220, light pipe 230, and microphone 240. FIG. 2B of an embodiment of device 200B can be understood as illustrating the same device of FIG. 2A, from a different viewpoint. In FIG. 2B, cosmetic grille 110, enclosure 130, airflow vent 150-3, battery compartment door 140 are visible. Additionally visible is cover 250, which forms a shield between an underlying circuit board and enclosure 130. Protruding through cover 250 is smoke chamber 260. A gap may be present between enclosure 130 and cover 250 to allow airflow through airflow vents 150 to have a relatively unobstructed path to enter and exit smoke chamber 260. Also present in FIG. 2B are multiple batteries, which are installed within battery compartment 270 of device 200B and which are accessible via battery compartment door 140.

Figure 2C:
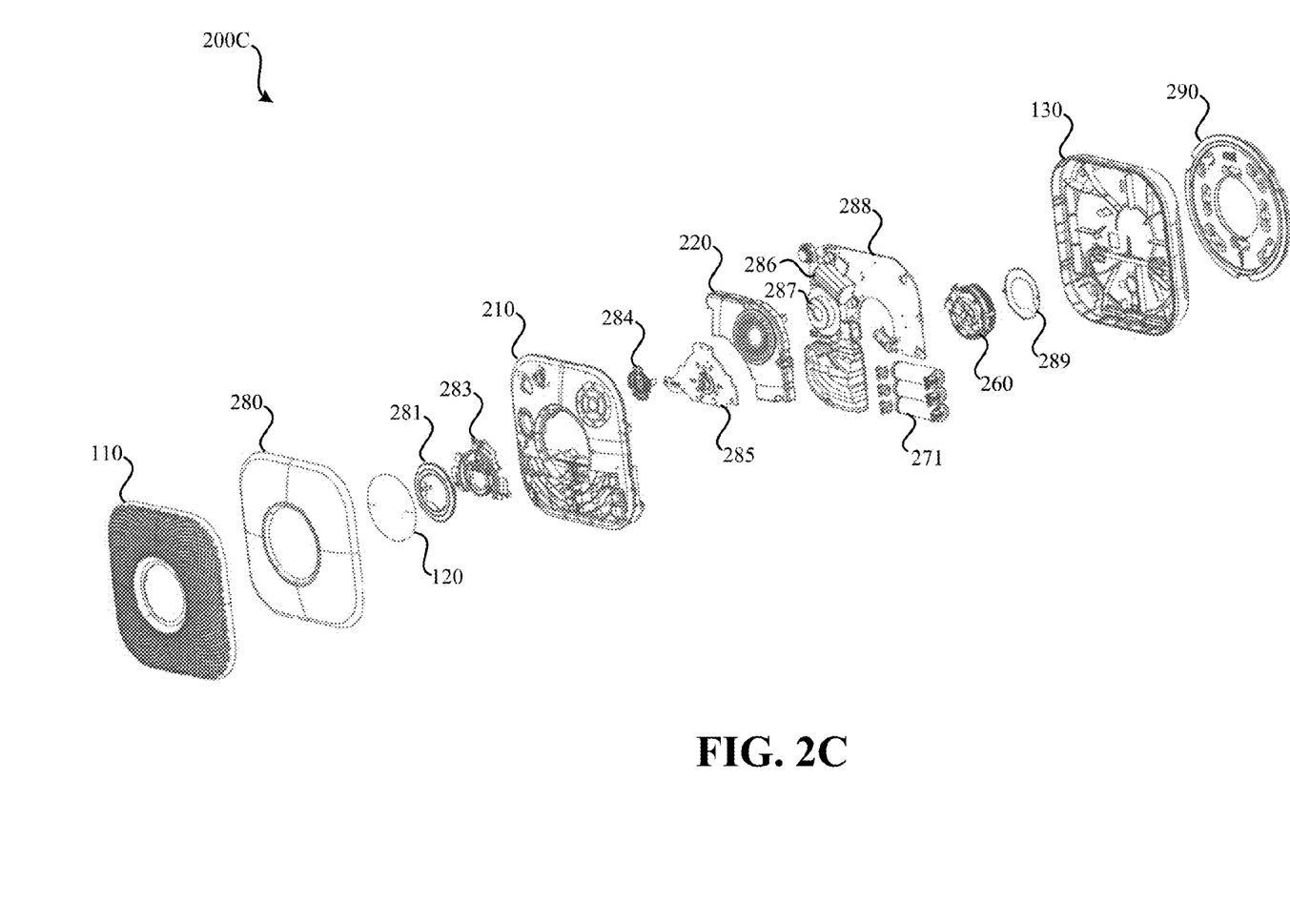

FIG. 2C represents a more comprehensive exploded view of a smart combined smoke detector and carbon monoxide detector device 200C. Device 200C may represent an alternate view of devices 100A, 100B, 200A, and 200B. Device 200C may include: cosmetic grille 110, cosmetic mesh 280, lens/button 120, button support 281, light pipe 282, button flexure 283, main chassis 210, passive infrared (PIR) sensor 287, gasket 284, microphone 240, light emitting diode(s) (LEDs) 291, printed circuit board (PCB) 285, speaker 220, carbon monoxide (CO) sensor 286, buzzer (not pictured), PCB 288, smoke chamber 260, chamber shield 289, cover 250, enclosure 130, and wall plate 290. It should be understood that alternate embodiments of device 200C may include a greater number of components or fewer components than presented in FIG. 2C.

A brief description of the above noted components that have yet to be described follows: Cosmetic mesh 280 sits behind cosmetic grille 110 to obscure external visibility of the underlying components of device 200C while allowing for airflow through cosmetic mesh 280. Button support 281 serves to support lens/button 120 yet allows lens/button 120 to be actuated by a user. Light pipe 282 serves to direct light generated by lights (e.g., LEDs such as LEDs 291 present on PCB 285) to the external environment of device 200C by reflecting off of cosmetic grille 110. Button flexure 283 serves to allow a near-constant pressure to be placed by a user on various locations on lens/button 120 to cause actuation. Button flexure 283 may cause an actuation sensor located off-center from lens/button 120 to actuate in response to user-induced pressure on lens/button 120. PCB 285 may have multiple lights (e.g., LEDs 291) and PIR sensor 287 (or other form of sensor). Gasket 284 may help isolate PIR sensor 287 and/or other temperature-sensitive components from heat energy emitted from LEDs 291 and/or other heat-emitting components. Gasket 284 may also help isolate PIR sensor 287 from dust, bugs, and other matter that may affect performance. PCB 285 may be in communication with components located on PCB 288. PIR sensor 287 or other form of sensor on PCB 285 may sense the external environment of device 200C through lens/button 120.

Buzzer 287, which may be activated to make noise in case of an emergency (and when testing emergency functionality), and carbon monoxide sensor 286 may be located on main circuit board 288. Main circuit board 288 may interface with one or more batteries 271, which serve as either the primary source of power for the device or as a backup source of power if another source, such as power received via a wire from the grid, is unavailable. Protruding through main circuit board may be smoke chamber 260, such that air (including smoke if present in the external environment) passing into enclosure 130 is likely to enter smoke chamber 260. Smoke chamber 260 may be capped by chamber shield 289, which may be conductive (e.g., metallic). Smoke chamber 260 may be encircled by a conductive (e.g., metallic) mesh (not pictured). Enclosure 130 may be attached and detached from surface mount plate 290. Surface mount plate 290 may be configured to be attached via one or more attachment mechanism (e.g., screws or nails) to a surface, such as a wall or ceiling, to remain in a fixed position. Enclosure 130 may be attached to surface mount plate 290 and rotated to a desired orientation (e.g., for aesthetic reasons). For instance, enclosure 130 may be rotated such that a side of enclosure 130 is parallel to an edge of where a wall meets the ceiling in the room in which device 200C is installed.

Figure 2D:
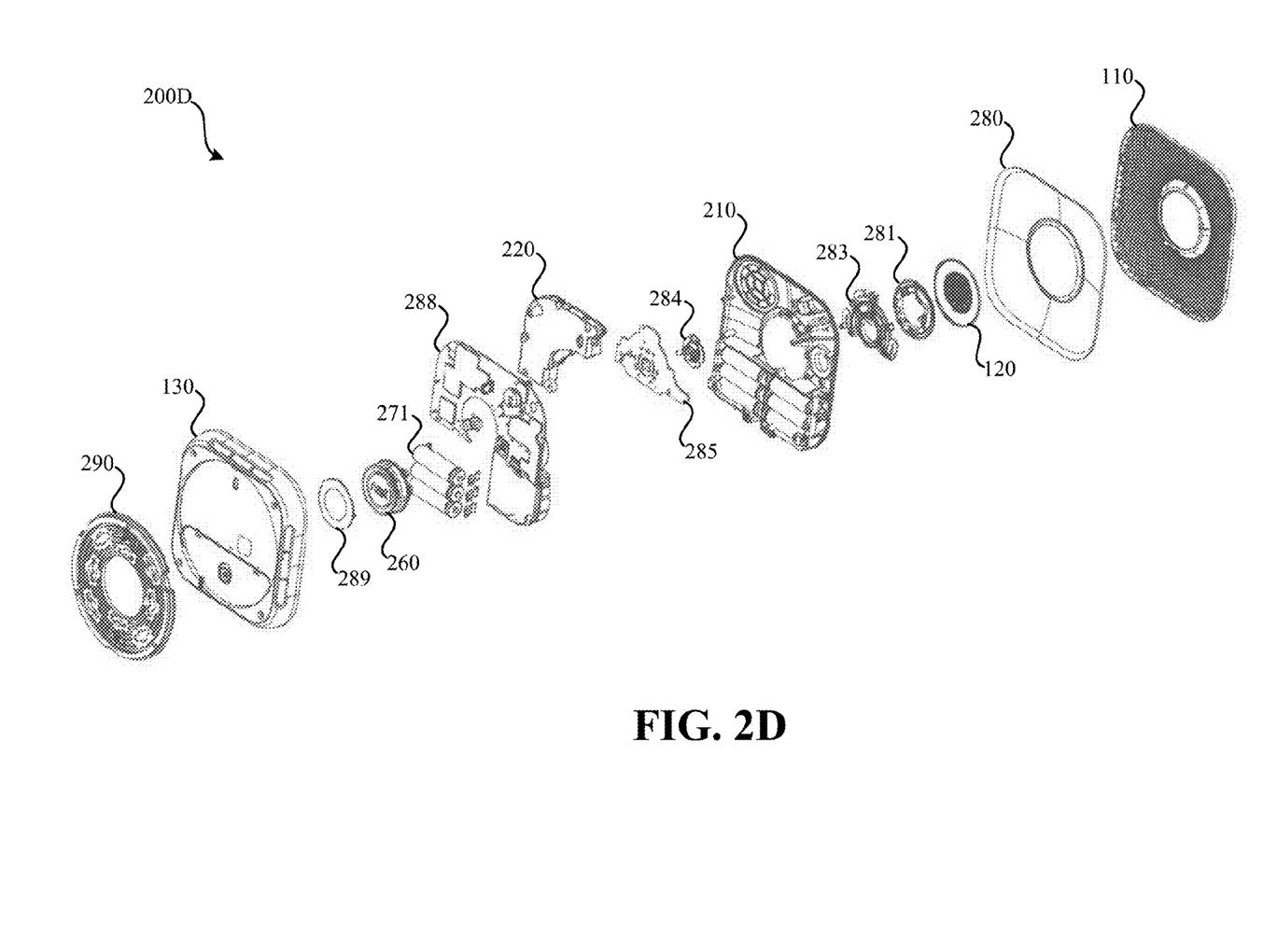

FIG. 2D represents the comprehensive exploded view of the smart combined smoke detector and carbon monoxide detector device of FIG. 2C viewed from a reverse angle as presented in FIG. 2C. Device 200D may represent an alternate view of devices 100A, 100B, 200A, 200B, and 200C. Device 200D may include: cosmetic grille 110, cosmetic mesh 280, lens/button 120, light guide 281, button flexure 283, main chassis 210, diaphragm 284, passive infrared (PIR) and light emitting diode (LED) daughterboard 285, batteries 271, speaker 220, carbon monoxide (CO) sensor 286, buzzer 287, main circuit board 288, smoke chamber 260, chamber shield 289, enclosure 130, and surface mount plate 290. It should be understood that alternate embodiments of device 200D may include a greater number of components or fewer components than presented in FIG. 2C.

FIGS. 3A, 3B, 3C, and 3D illustrate an embodiment of a circuit board with thermal elements that minimize heat transfer from heat-emitting component(s) to heat-sensitive component(s). The circuit board of FIGS. 3A-3D can be understood as representing various views of PCB 285 of FIGS. 2C and 2D.

Figure 3A:
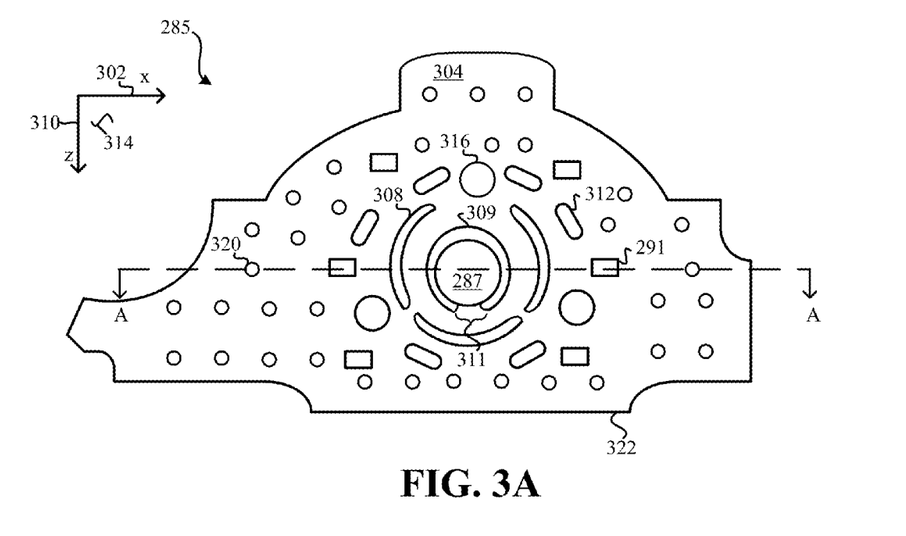
FIGS. 3A, 3B, 3C and 3D illustrate an embodiment of a PCB having thermal elements for reducing heat flow to heat-sensitive component(s).
Figure 3B:
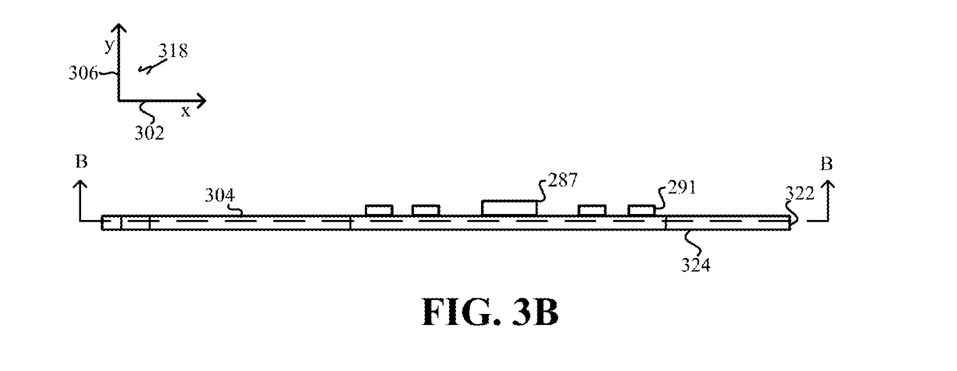

FIGS. 3A and 3B are top and side views, respectively, and show PCB 285 having a length along horizontal x-axis 302, a thickness along vertical y-axis 306, and a depth along horizontal z-axis 310. FIG. 3A shows top outer surface 304 of PCB 285 lying in horizontal xz-plane 314, and outer edge 322 surrounding an outer periphery of PCB 285. Heat-sensitive PIR sensor 287 and heat-emitting LEDs 291 are mounted on top outer surface 304. In some embodiments, LEDs 291 are arranged along horizontal xz-plane 314 so as to surround PIR sensor 287, which is mounted near a center of top outer surface 304, as measured along horizontal xz-plane 314. In some embodiments, six LEDs 291 on mounted on top surface 304 to provide ample light. Located along horizontal xz-plane 314, between PIR sensor 287 and LEDs 291, are through holes formed as inner and outer arched slots 308, 309, straight slots 312, and circles 316. In some embodiment, inner arched slots 309 surround most of outer perimeter of PIR sensor 287, leaving only a small portion 311 through which heat can conduct and reach PIR sensor 287. Located along horizontal xz-plane 314, generally between LEDs 291 and outer edge 322 are plated vias 320. FIG. 3B shows bottom outer surface 324 of PCB 285. Top and bottom outer surfaces 304, 324 are spaced along vertical y-axis 306, and lie generally parallel to horizontal x-axis 302.

Figure 3C:
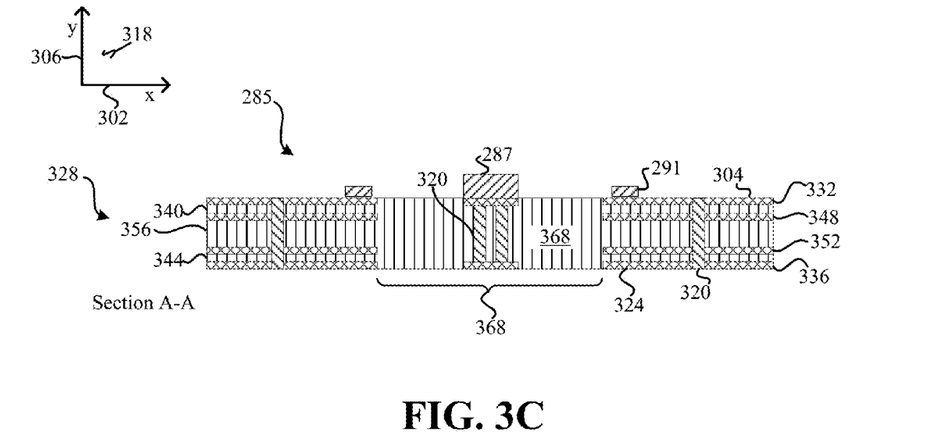

FIG. 3C is a cross-sectional view of PCB 285 taken along cutting-plane line A-A of FIG. 3A, and shows multi-layer stack 328 of PCB 285. Outer conductive layers 332, 336 are spaced along vertical y-axis 306 between top and bottom surfaces 304, 324, and lie generally parallel to horizontal x-axis 302. Outer dielectric layers 340, 344 are spaced along vertical y-axis 306 between outer conductive layers 332, 336, and lie generally parallel to horizontal x-axis 302. Inner conductive layers 348, 352 are spaced along vertical y-axis 306 between outer dielectric layers 340, 344, and lie generally parallel to horizontal x-axis 302. Middle dielectric layer 356 is located along vertical y-axis between inner conductive layers 348, 352, and lies generally parallel to horizontal x-axis 302. Plated vias 320 extend along vertical y-axis 306 through portions of multi-layer stack 328, and electrically interconnect various layers and/or components of PCB 285.

In some embodiments, individual conductive layers 332, 336, 348, 352 provide one or more of ground, power, and signal routing. For example, one or more of conductive layers 332, 336, 348, 352 can be a solid power plane connected to power, a solid plane connected to power and having embedded traces for transmitting signals or connecting to ground or power, a solid ground plane connected to ground, a solid plane connected to ground and having embedded traces for transmitting signals or connecting to ground or power, a trace layer that is a solid plane with embedded traces, a trace layer that is an individual trace, a trace layer that is a set of traces, and so on.

In some embodiments, plated vias 320 extend along vertical y-axis 306 through any portion of PCB 285 and electrically couple any two or more of PIR sensor 287, LEDs 291, and conductive layers 332, 336, 348, 352. For example, a single plated via 320 can electrically couple any one of PIR sensor 287 and LEDs 291 to any one or more of conductive layers 332, 336, 348, 352. Also for example, a single plated via 320 can electrically couple any one of conductive layers 332, 336, 348, 352 to any one of conductive layers 332, 336, 348, 352.

In some embodiments, conductive layers 332, 336, 348, 352 and the plating used to plated vias 320 are constructed of copper, aluminum, and/or any other suitable electrically conductive material known to those having ordinary skill in the art. In some embodiments, dielectric layers 332, 336, 356 are constructed of FR-4 and/or any other suitable electrically insulating material known to those having ordinary skill in the art.

Figure 3D:
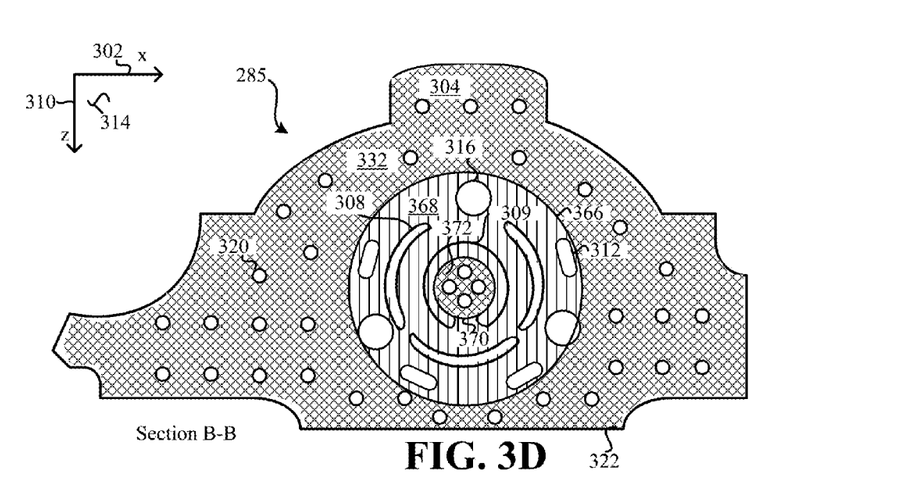

FIG. 3D is a cross-sectional view of PCB 285 taken along cutting-plane line B-B of FIG. 3B, and shows a top view of conductive layer 332 surrounding an outer lateral periphery 366 of metal-free region 368. Inner lateral periphery 370 of metal-free region 368 surrounds ground-metal arrangement 372, which is aligned along horizontal xz-plane 314 with, and spaced along vertical y-axis 306 from, PIR sensor 287. Ground-metal arrangement 372 helps shield PIR sensor 287 from radio frequency (RF) interference. Linear hatching inside outer inner and outer lateral peripheries 370, 366 represents non-metallic material, and crosshatching inside of inner lateral periphery 370 and outside of outer lateral periphery 366 represents metallic material.

In some embodiments, as shown in FIG. 3D, metal-free region 368 extends along horizontal xz-plane 314 between inner and outer lateral peripheries 370, 366. Through holes 308, 309, 312, 316 are spaced inside of metal-free region 368, whereas metal-plated vias 320 are spaced outside of metal-free region 368. Some metal-plated vias 320 are spaced along xz-plane 314 outside of outer lateral periphery 366, and others are spaced inside of inner lateral periphery 370. These later metal-plated vias 320 are part of ground-metal arrangement 372. In some embodiments, ground-metal arrangement 372 is omitted from PCB 285, at the illustrated location along vertical y-axis 306 or altogether, and metal-free region 368 fills the entire area inside of outer lateral periphery 366. In some embodiments, In some embodiments, as shown in FIG. 3C, metal-free region 368 extends along vertical y-axis 306 through all conductive layers 322, 336, 348, 352. In some embodiments, metal-free region 368 extends along vertical y-axis 306 at least partially through one or more of conductive layers 332, 336, 348, 352. For example, metal-free region 368 can extend along vertical y-axis through conductive layer 332. In this example, conductive layer 332 can be a metal plane with an outer edge that corresponds to outer edge 322 of PCB 285 and an inner edge that corresponds to outer lateral periphery 366 of metal-free region 368. Continuing with this example, metal-free region 368 can correspond to a through-hole formed in conductive layer 332.

In some embodiments, PCB 285 includes multiple metal-free regions 368 spaced along vertical y-axis 306 and/or horizontal xy-plane 314. For example, either or both of conductive layers 348, 352 can be spaced along vertical y-axis 306 between first and second metal-free regions, and aligned along xy-plane 314 with first and second metal-free regions.

Figure 4:
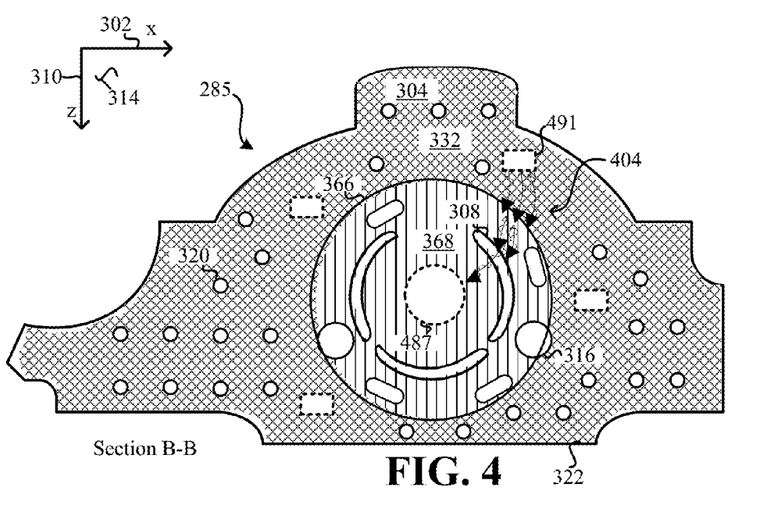
FIG. 4 is a cross-sectional view of PCB taken along cutting-plane line B-B of FIG. 3B.

With reference FIGS. 4 and 5, thermal benefits of PCB 285 are described below. FIG. 4, like FIG. 3D, is a cross-sectional view of PCB 285 taken along cutting-plane line B-B of FIG. 3B, and shows a top view of conductive layer 332 and metal-free region 368. FIG. 4 also includes annotations 404 that show radial heat flow. Phantom line 487 shows an area of conductive layer 332 that is aligned along horizontal xz-plane 314 with PIR sensor 287, and phantom lines 491 show areas aligned with LEDs 291.

As noted, in some embodiments, conductive layer 322 is made of an electrically conductive material, such as copper, aluminum, or other metals or material suitable for conducting electricity. These materials typically have fairly high thermal conductivity. Therefore, conductive layer 332 conducts heat at a fairly high heat-transfer rate. Most of this heat flows radially, along horizontal xz-plane 314, from higher-temperature areas near 491, which are generally aligned with heat-emitting LEDs 291, to lower-temperature areas.

In some embodiments, metal-free region 368 physically and thermally isolates PIR sensor 287 by providing a thermal-resistant barrier around lower-temperature area 487, which is generally aligned with PIR sensor 287. Metal-free region 368 has a lower thermal conductivity than the region outside of outer periphery 366. Thus, metal-free region 368 resists radial heat flow 404, along horizontal xz-plane 314, from higher-temperature areas near 491 to lower-temperature areas near 487, which is generally aligned along vertical y-axis 306 with PIR sensor 287. Metal-free region 368 also resists heat flow along vertical y-axis 306 to PIR sensor 287. In some embodiments, metal-free region 368 is a void, filled with air. In some embodiments, metal-free region 368 is filled with insulating material, such as the dielectric material of dielectric layers 348, 352, 356. In some embodiments, metal-free region 368 is a ground-metal-free region that excludes ground metal, and permits metal for signals and/or power. As noted, in some embodiments, metal-free region 368 can extend between any locations along vertical y-axis 306. For example, metal-free region 368 can extend through any one or more layers of multilayer stack 328.

In some embodiments, thermal-isolation holes 308, 309, 312, 316 physically and thermally isolate PIR sensor 287 by providing thermal-resistant barriers spaced along horizontal xz-axis 306, between heat-emitting LEDs and heat-sensitive PIR sensor 287. Thermal-isolation holes 308, 309, 312, 316 fill with air, thereby providing air pockets between PIR sensor 287 and LEDs 291. In some embodiments, air has a lower thermal conductivity than solid materials of PCB 285 (e.g., dielectric and/or conductive materials). Thus, thermal-isolation hole 308, 309, 312, 316 resist radial heat flow 404, along horizontal xz-plane 314, from higher-temperature areas near LEDs 291 to lower-temperature areas near PIR sensor 287.

In some embodiments, metal-free region 368 and thermal-isolation holes 308, 309, 312, 316 combine to resist radial heat flow toward lower-temperature areas 487 near PIR sensor 287. When radial heat flow 404 from higher-temperature area 491 reaches meat-free region 368, the heat-flow rate decreases because metal-free region 368 has a lower thermal conductivity than the metal surrounding outer periphery 366. This rate decrease is shown where the number of arrows decreases from three to two. Further, when the heat flow reaches thermal-isolation hole 308, the heat-transfer rate decreases even further, and still further upon reaching thermal-isolation hole 309. This is shown where the number of arrows 404 decreases from two to one. In some embodiments, this further decrease might occur because air has a lower thermal conductivity than metal-free region 368, because some heat is convected to ambient air, because thermal-isolation hole 308 extends farther along vertical y-axis 306 and therefore slows radial heat flow in vertically adjacent layers, and/or because heat dissipates as it travels farther from its source.

In some embodiments, thermal-isolation holes 308, 309, 312, 316 provide thermal pathways off of PCB 285. In some embodiments, when heat flowing from areas near LEDs 291 reaches thermal-isolation holes 308, 309, 312, 316, that heat is convected and radiated to ambient air. In some embodiments, thermal-isolation holes 308, 309, 312, 316 are metal plated, allowing thermal-isolation holes 308, 309, 312, 316 to conduct more heat away from area 487, and convect and radiate that heat to the ambient air. In some embodiments, circular thermal-isolation holes 316 also serve as screw holes, and can have dimensions that are larger than what is necessary to accommodate screw heads and permit access to those screw heads. Larger thermal-isolation holes 308, 309, 312, 316 provide more thermal resistance, but should be sized to keep PCB 285 strong enough to withstand forces associated with use of the device, such as force resulting from users pushing button/lens 102 (FIG. 2C). In some embodiments, thermal-isolation holes 308, 309, 312, 316 are located along horizontal xz-plane 314 inside outer periphery 366 of metal-free region 368. In some embodiments, thermal-isolation holes 308, 309, 312, 316 can extend between any locations along vertical y-axis 306. For example, thermal-isolation holes 308, 309, 312, 316 can extend the entire thickness of PCB 285.

In some embodiments, plated vias 320 provide thermal pathways that route heat emitted by LEDs 291 away from PIR sensor 287. Plated vias 320 are plated with copper, aluminum, or any other suitable thermally and electrically conductive material, and spaced along horizontal xz-plane 314 outside of outer periphery 366. This increases the thermal mass of the area outside of metal-free region 368, and conducts heat away from PIR sensor 287. In some embodiments, plated vias 320 conduct at least some heat along vertical y-axis and convect that heat from top and/or bottom surfaces 304, 324 to ambient air. In some embodiments, plated vias 320 conduct at least some heat along horizontal xz-plane and convect that heat from outer edge 322 to ambient air. In some embodiments, metal-plated vias 320 are plated with thick copper, which conducts more heat than traditional plating.

In some embodiments, large thermal pads connect LEDs 291 to conductive layer 332, and provide thermal pathways that route heat emitted by LEDs 291 away from PIR sensor 287. In some embodiments, the large thermal pads conduct heat along vertical y-axis 306 to conductive layer 332, which conducts that heat out of PCB 285, such as via convection to ambient air through plated via 320, thermal through-holes 308, 309, 312, 316, and/or outer edge 322. In some embodiments, plated vias 320 are located underneath these large thermal pads, and heat is conducted from LEDs 291 to the large thermal pads, and to metal-plated vias 320, which convect and radiate the heat to ambient air.

Figure 5:
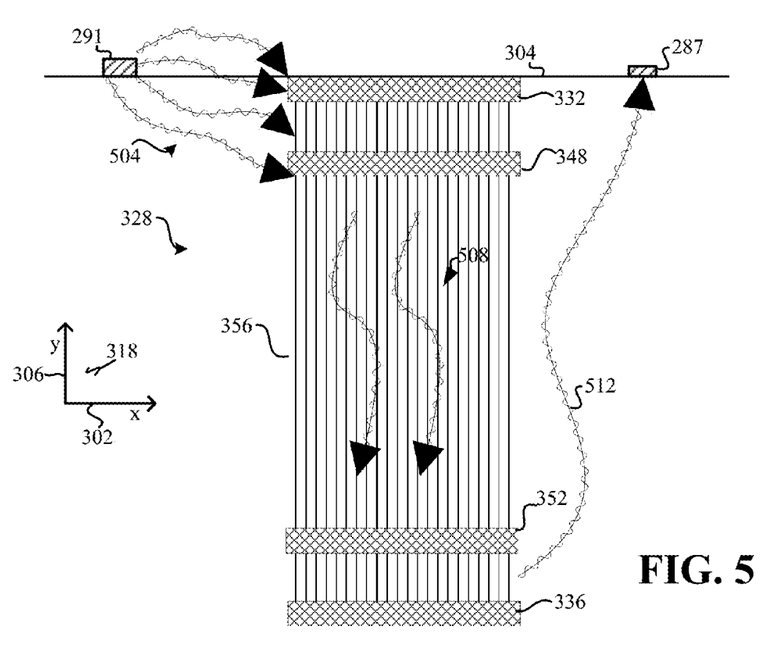
FIG. 5 is a cross-sectional view of PCB taken along cutting-plane line A-A of FIG. 3A.

FIG. 5, like FIG. 3C, is a cross-sectional view of PCB 285 taken along line A-A of FIG. 3A, and shows multi-layer stack 328 of PCB 285. FIG. 5 also includes annotations that show heat flow generally parallel to vertical y-axis 306. In some embodiments, the layer construction and circuit design physically and thermally isolates PIR sensor 287 by providing a thermal-resistant barrier (e.g., middle dielectric layer 356) along vertical y-axis 306 between layers that support heat-emitting LEDs and layers that support heat-sensitive PIR sensor 287. In some embodiments, top conductive layers 332, 348 support heat-emitting LEDs 291, bottom conductive layers 352, 336 support heat-sensitive PIR sensor 287, and middle dielectric layer 356 is sized or otherwise configured to sufficiently limit heat flow along vertical y-axis from top conductive layers 332, 348 to bottom conductive layers 352, 336, thereby reducing heat flow to PIR sensor 287 via conduction through bottom conductive layers 352, 336. Supporting LEDs 291 with top conductive layers 332, 348 can also help isolate heat along vertical y-axis 306 near top surface 304, where heat can be convected and radiated to ambient air. In some embodiments, bottom conductive layers 352, 336 (rather top conductive layers 332, 348) support high-heat components (e.g., LEDs 291), whereas top conductive layers 332, 348 support heat-sensitive components (e.g., PIR sensor 287). For example, this arrangement is desirable in the event high-heat components are mounted on bottom surface 324 (rather than top surface 304) of PCB 285.

An example is provided with reference to annotations 504, 508, 512 of FIG. 5. In this example, top conductive layers 332, 348 support high-heat LEDs 291, whereas bottom conductive layers 352, 336 support heat-sensitive PIR sensor 287. Further, in this example, top conductive layers 332, 348 are made of copper and have relatively high thermal conductivity, and heat emitted from LEDs 291 flows to top conductive layers 332, 348 at a first heat-transfer rate, as shown by the four arrows at 504. Middle dielectric layer 356 has relatively low thermal conductivity, and slows the heat flow to a second, lower heat-transfer rate, as shown by the two arrows at 508. Heat transfers from middle dielectric layer 356 to PIR sensor 287, via conduction through bottom conductive layers 352, 336. Although these layers 352, 336 have a higher thermal conductivity than middle dielectric layer 356, they still add thermal resistance, which slows the heat flow to a third, even slower heat-transfer rate, as shown by the single arrow at 512. In some embodiments, heat-transfer rate 512 is half or less than half of heat-transfer rate 504.

In some embodiments, PIR sensor 287 and LEDs 291 are mounted to top outer conductive layer 332, which grounds LEDs 291 and provides some traces for PIR sensor 287 and LEDs 291. Top inner conductive layer 348 includes traces that route signals to LEDs 291, whereas bottom inner conductive layer 352 includes traces that route signals to PIR sensor 287. Middle dielectric layer 356 provides a large amount of thermal resistance between top and bottom inner conductive layers 348, 352 for insulating traces that route signals to PIR sensor 287 from traces that route signals to LEDs 291.

In some embodiments, some or all of top and bottom conductive layers 360, 364 are thick copper layers. This increases the thermal mass of the area outside of metal-free region 368, and conducts heat away from PIR sensor 287. In some embodiments, some or all of conductive layers 332, 336, 348, 352 include long, narrow traces that follow a serpentine path. The longer and narrower the traces are, then the higher the thermal resistance, and the harder it is for heat to flow through the traces. For example, conductive layer 352 may include traces that route signals to PIR sensor 287 and/or other heat-sensitive components. In this example, those traces are long, narrow and follow a serpentine path. This minimizes the heat-transfer rate of heat conducted via these traces to PIR sensor 287 and/or other heat-sensitive components.

Figures 6A, 6B:
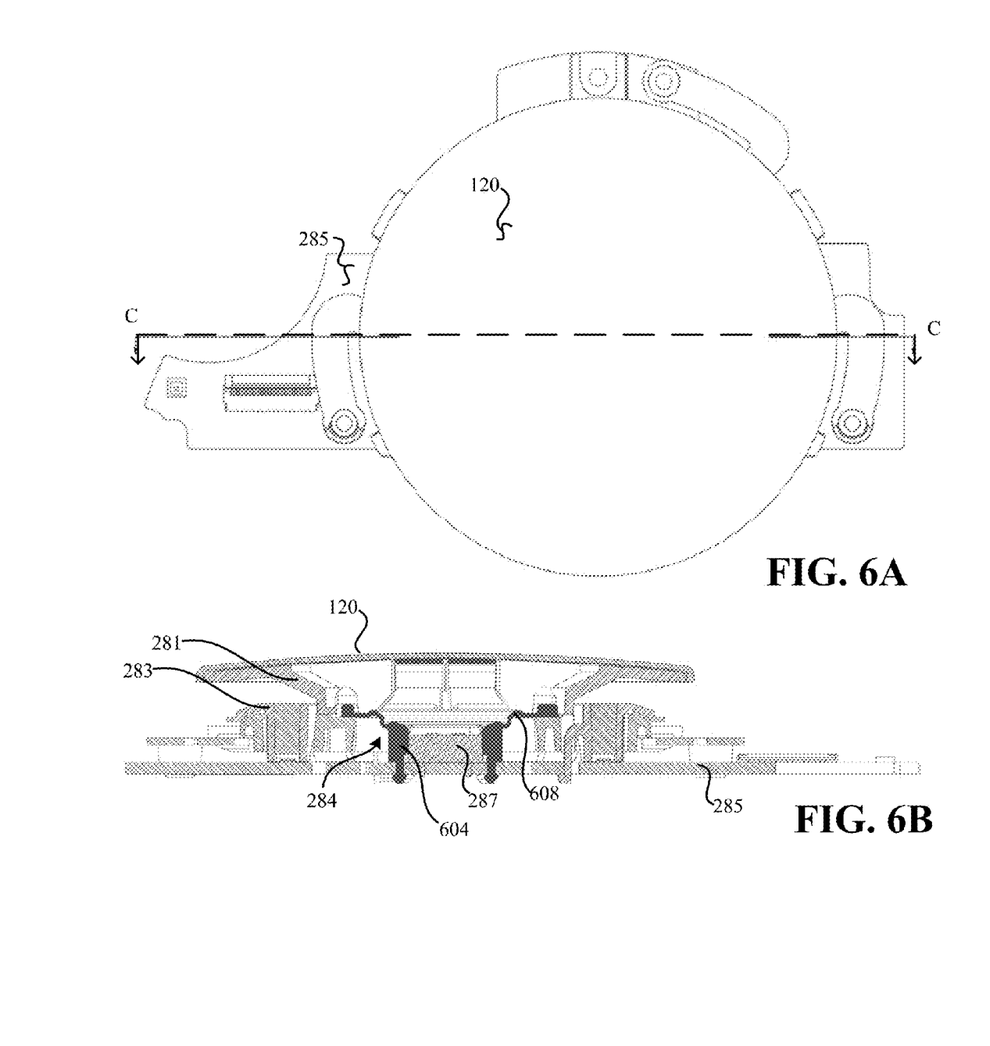
FIGS. 6A and 6B illustrate an embodiment of components of a smart combined smoke detector and carbon monoxide device.

FIG. 6A shows a top view of an embodiment of some components of a smart combined smoke detector and carbon monoxide device, and FIG. 6B is a cross-sectional view of those components taken along cutting-plane line C-C of FIG. 6A. One of the illustrated components is gasket 284. In some embodiments, gasket 284 physically and thermally isolates PIR sensor 287 by providing thermal-resistant barrier around heat-sensitive PIR sensor 287, thereby limiting heat transfer from LEDs 291 via radiation and/or convection. In some embodiments, gasket 284 is disposed between support lens/button 120 and PCB 285, and at least partially encloses PIR sensor 287. In some embodiments, gasket 284 includes sleeve 604 and flange 608. Sleeve 604 slides tightly over and surrounds at least a portion of outer periphery of a body portion of PIR sensor 287, thereby providing a thermal-isolation barrier at least partially around PIR sensor 287. In some embodiments, 608 flange is a flexible diaphragm that flexes and deforms to allow actuation of button/lens 102, while enabling sleeve 604 to maintain a seal around PIR sensor 287. In some embodiments, gasket 284 is made of a silicone rubber sleeve Referring again to FIGS. 3A-3D, in some embodiments, top and bottom surfaces 304, 324 are surface finishes applied to top and bottom sides of PCB 285. Examples of such surface finishes include silkscreen (e.g., non-conductive epoxy) and solder mask (e.g., liquid polymer). In some embodiments, the solder mask can include tin, gold, lead, nickel, etc. In some embodiments, outer and middle dielectric layers 340, 344, 356 could be any substance that is a poor conductor of electricity so as to electrically insulate conductive layers 332, 336, 348, 352. Examples of suitable dielectric material are FR-4 and other composites, such as woven fiberglass with resin-based surface coating. For example, dielectric material could be FR-4 that is compliant with standards set by National Electronic Manufactures Association (NEMA), that is flame resistant, and that has a good strength-to-weight ratio. In some embodiments, conductive layers 332, 336, 348, 352 can be any substance that is a good conductor of electricity so as to transmit electricity to and from PIR Sensor 287, LEDs 291 and/or other electrical components mounted on PCB 285. For example, conductive layers 332, 336, 348, 352 could be made of metal, such as copper or aluminum.

While specific configurations of PCB 285 have been described, it is understood that embodiments can include a wide variety of heat-emitting and heat-sensitive components and layer stacks. Examples of heat-emitting and heat-sensitive components include integrated circuits, bridge rectifiers, transistors, semiconductors, diodes, fuses, batteries, transformers, relays, crystals, oscillators, inductors, capacitors, potentiometers, resistors, switches, LEDs, LED displays, piezo elements and buzzers, electret components, microphones, condensers, network components, resonators, solar cells, thermocouples, thermal sensors, heat sensors, temperature sensors, force sensors, density sensors, level sensors, pressure sensors, optical sensors, light sensors, image sensors, photon sensors, presence sensors, proximity sensors, radiation sensors, flow sensors, fluid velocity sensors, environmental sensors, weather sensors, moisture sensors, humidity sensors, electric current sensors, electric potential sensors, magnetic sensors, radio sensors, chemical sensors, acoustic sensors, sound sensors, vibration sensors, and any other components known to those have ordinary skill in the art. Embodiments can include layer stacks, such as multi-layer stack 328, having any number and type of conductive and non-conductive layers, arranged in any sequence. Such layers can be made of any suitable dietetic or conductive material, have any thickness, coating, finish, or laminate know to those having ordinary skill in the art.

Figure 7:
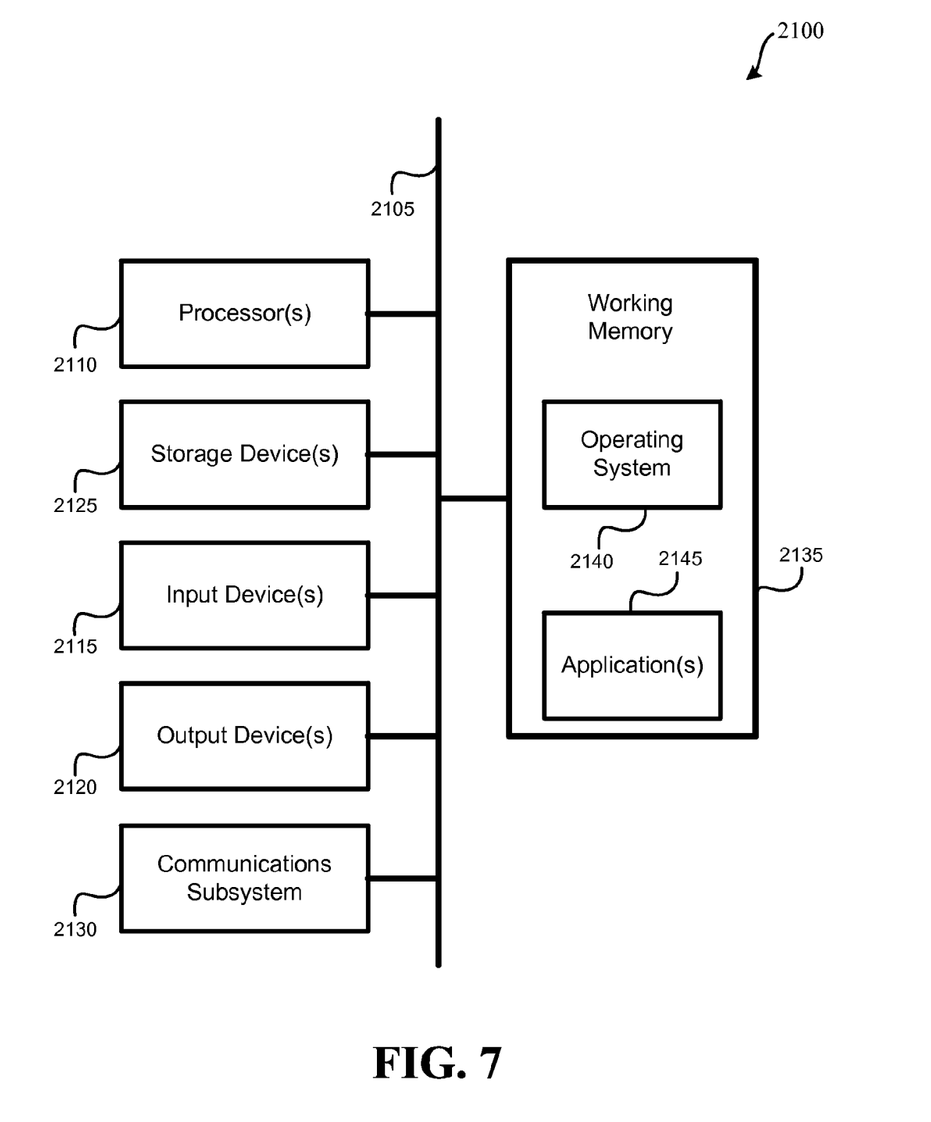
FIG. 7 illustrates an embodiment of a computer system, which may be incorporated as part of the smoke detector and/or carbon monoxide devices detailed herein.

A computer system as illustrated in FIG. 7 may be incorporated as part of the previously described computerized devices, such as the processing system on-board the device of FIG. 2C. FIG. 7 provides a schematic illustration of one embodiment of a computer system 700 that can perform various steps of the methods provided by various embodiments. It should be noted that FIG. 7 is meant only to provide a generalized illustration of various components, any or all of which may be utilized as appropriate. FIG. 7, therefore, broadly illustrates how individual system elements may be implemented in a relatively separated or relatively more integrated manner.

The computer system 700 is shown comprising hardware elements that can be electrically coupled via a bus 705 (or may otherwise be in communication, as appropriate). The hardware elements may include one or more processors 710, including without limitation one or more general-purpose processors and/or one or more special-purpose processors (such as digital signal processing chips, graphics acceleration processors, video decoders, and/or the like); one or more input devices 715, which can include without limitation a mouse, a keyboard, remote control, and/or the like; and one or more output devices 720, which can include without limitation a display device, a printer, and/or the like.

The computer system 700 may further include (and/or be in communication with) one or more non-transitory storage devices 725, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable and/or the like. Such storage devices may be configured to implement any appropriate data stores, including without limitation, various file systems, database structures, and/or the like.

The computer system 700 might also include a communications subsystem 730, which can include without limitation a modem, a network card (wireless or wired), an infrared communication device, a wireless communication device, and/or a chipset (such as a Bluetooth™ device, an 802.11 device, a WiFi device, a WiMax device, cellular communication device, etc.), and/or the like. The communications subsystem 730 may permit data to be exchanged with a network (such as the network described below, to name one example), other computer systems, and/or any other devices described herein. In many embodiments, the computer system 700 will further comprise a working memory 735, which can include a RAM or ROM device, as described above.

The computer system 700 also can comprise software elements, shown as being currently located within the working memory 735, including an operating system 740, device drivers, executable libraries, and/or other code, such as one or more application programs 745, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer);

in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium, such as the non-transitory storage device(s) 725 described above. In some cases, the storage medium might be incorporated within a computer system, such as computer system 700. In other embodiments, the storage medium might be separate from a computer system (e.g., a removable medium, such as a compact disc), and/or provided in an installation package, such that the storage medium can be used to program, configure, and/or adapt a general purpose computer with the instructions/code stored thereon. These instructions might take the form of executable code, which is executable by the computer system 700 and/or might take the form of source and/or installable code, which, upon compilation and/or installation on the computer system 700 (e.g., using any of a variety of generally available compilers, installation programs, compression/decompression utilities, etc.), then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 700) to perform methods in accordance with various embodiments of the invention. According to a set of embodiments, some or all of the procedures of such methods are performed by the computer system 700 in response to processor 710 executing one or more sequences of one or more instructions (which might be incorporated into the operating system 740 and/or other code, such as an application program 745) contained in the working memory 735. Such instructions may be read into the working memory 735 from another computer-readable medium, such as one or more of the non-transitory storage device(s) 725. Merely by way of example, execution of the sequences of instructions contained in the working memory 735 might cause the processor(s) 710 to perform one or more procedures of the methods described herein.

The terms "machine-readable medium," "computer-readable storage medium" and "computer-readable medium," as used herein, refer to any medium that participates in providing data that causes a machine to operate in a specific fashion. These mediums may be non-transitory. In an embodiment implemented using the computer system 700, various computer-readable media might be involved in providing instructions/code to processor(s) 710 for execution and/or might be used to store and/or carry such instructions/code. In many implementations, a computer-readable medium is a physical and/or tangible storage medium. Such a medium may take the form of a non-volatile media or volatile media. Non-volatile media include, for example, optical and/or magnetic disks, such as the non-transitory storage device(s) 725. Volatile media include, without limitation, dynamic memory, such as the working memory 735.

Common forms of physical and/or tangible computer-readable media include, for example, a floppy disk, a flexible disk, hard disk, magnetic tape, or any other magnetic medium, a CD-ROM, any other optical medium, any other physical medium with patterns of marks, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processor(s) 710 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 700.

The communications subsystem 730 (and/or components thereof) generally will receive signals, and the bus 705 then might carry the signals (and/or the data, instructions, etc. carried by the signals) to the working memory 735, from which the processor(s) 710 retrieves and executes the instructions. The instructions received by the working memory 735 may optionally be stored on a non-transitory storage device 725 either before or after execution by the processor(s) 710.

It should further be understood that the components of computer system 700 can be distributed across a network. For example, some processing may be performed in one location using a first processor while other processing may be performed by another processor remote from the first processor. Other components of computer system 700 may be similarly distributed. As such, computer system 700 may be interpreted as a distributed computing system that performs processing in multiple locations. In some instances, computer system 700 may be interpreted as a single computing device, such as a distinct laptop, desktop computer, or the like, depending on the context.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims. Also, the terms vertical and horizontal as used herein are merely relative to each other and are not intended to connote absolute directions.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A thermal-isolation assembly, comprising:
   a multilayer circuit board, including:
      first and second conductive layers;
      a middle dielectric layer located between the first and second conductive layers;
      a metal-free region formed in the first conductive layer; and
   a heat-emitting component and a heat-sensitive component being mounted on top of the multilayer circuit board and horizontally separated by at least a portion of the metal-free region, wherein the heat-sensitive component is electronically coupled to the first conductive layer and the heat-emitting component is electrically coupled to the second conductive layer;
   wherein the middle dielectric layer thermally insulates the heat-sensitive component by resisting vertical heat flow from the second conductive layer;
   wherein the metal-free region thermally insulates the heat-sensitive component by resisting horizontal heat flow from the first conductive layer.

2. The thermal-isolation assembly of claim 1, further comprising:
   a plurality of through holes vertically extending through the metal-free region wherein the through holes resist horizontal heat flow from the first conductive layer.

3. The thermal-isolation assembly of claim 1, further comprising:
   a plurality of metal-plated vias vertically extending through the first and second conductive layers, wherein the metal-plated vias provide thermal paths away from the heat-sensitive component.

4. The thermal-isolation assembly of claim 1, further comprising:
   a silicon rubber sleeve fitted around a portion of the heat-sensitive component, the silicon rubber sleeve thermally isolates the heat-sensitive component by resisting heat transfer by radiation to the heat-sensitive component.

5. The multilayer circuit board of claim 1, wherein the heat-emitting component is an LED and the heat-sensitive component is a PIR sensor, both installed in a combined smoke detector and carbon monoxide device.

6. The thermal-isolation assembly of claim 1, wherein the metal-free region is free of metal ground planes but includes metal ground, power, or signal traces.

7. A multilayered circuit board, comprising:
   a first conductive layer lying generally parallel to a horizontal plane;
   a metal-free region extending along a vertical axis through at least a portion of the first conductive layer; and
   a first outer surface being located along the vertical axis above the first conductive layer, lying generally parallel to the horizontal plane, and supporting a heat-emitting component and a heat-sensitive component, the heat-emitting component and the metal-free region being spaced along the vertical axis and the horizontal plane, the heat-sensitive component and the metal-free region being spaced along the vertical axis and generally aligned along the horizontal plane,
   wherein the metal-free region thermally isolates the heat-sensitive component by resisting heat flowing generally parallel to the horizontal plane towards the heat-sensitive component.

8. The multilayered circuit board of claim 7, wherein the metal-free region includes inner and outer peripheries, and the heat-sensitive component is aligned along the horizontal plane inside the inner periphery such that the metal-free region provides a thermal-isolation barrier along the horizontal plane between the heat-sensitive and heat-emitting components.

9. The multilayered circuit board of claim 7, wherein the metal-free region is free of metal ground planes but includes metal ground, power, or signal traces.

10. The multilayer circuit board of claim 9, further comprising:
    a second conductive layer being located along the vertical axis below the first conductive layer and lying generally parallel to the horizontal plane;
    a second metal-free region extending along the vertical axis through at least a portion of the second conductive layer, the first and second metal-free regions being spaced along the vertical axis and the horizontal plane, the first and second metal-free regions being spaced along the vertical axis and generally aligned along the horizontal plane.

11. The multilayer circuit board of claim 7, further comprising:
    a first connector extending generally parallel to the vertical axis and electrically coupling the heat-emitting component to the first conductive layer;
    a second connector extending generally parallel to the vertical axis and electrically coupling the heat-sensitive component to the second conductive layer; and
    a middle dielectric layer being located along the vertical axis between the first and second conductive layers and thermally resisting heat flow from the first conductive layer to the second conductive layer, thereby limiting return heat flow through the second connector to the heat-sensitive component.

12. The multilayer circuit board of claim 7, further comprising:
    a plurality of through holes extending along the vertical axis through the metal-free region and being spaced around the heat-sensitive component, wherein the through holes resist heat flow generally parallel to the horizontal plane towards the heat-sensitive component; and
    a plurality of metal-plated vias extending along the vertical axis and being located outside the metal-free region, wherein the metal-plated vias provide thermal paths away from the heat-sensitive component.

13. The multilayer circuit board of claim 7, further comprising:
a silicon rubber sleeve fitted around a portion of the heat-sensitive component that projects away from the first outer surface, the silicon rubber sleeve thermally isolates the heat-sensitive component by resisting heat transfer by radiation to the heat-sensitive component.

14. The multilayer circuit board of claim 7, wherein the heat-emitting component is an LED and the heat-sensitive component is a PIR sensor.

15. The multilayer circuit board of claim 14, wherein the multilayer circuit board is part of a hazard detector.

16. The multilayer circuit board of claim 7, wherein the second metal-free region is part of the metal-free region.

17. A multilayered circuit board, comprising:
first conducting means being located along a vertical axis;
a metal-free region extending along a vertical axis through at least a portion of the first conducting means; and
a first surface being located along the vertical axis above the first conducting means and supporting a heat-emitting means and a heat-sensitive component, the heat-emitting means and the metal-free region being vertically and laterally spaced apart, the heat-sensitive component and the metal-free region being vertically spaced apart and laterally aligned,
wherein the metal-free region thermally isolates the heat-sensitive component by resisting radial heat flow towards the heat-sensitive component.

18. The multilayered circuit board of claim 17, further comprising:
a second conducting means being located along the vertical axis below the first conducting means;
a first coupling means electrically coupling the heat-emitting means to the first conducting means; and
a second coupling means electrically coupling the heat-sensitive component to the second conducting means,
a middle insulating mean being located along the vertical axis between the first and second conducting means, the middle insulating means thermally resisting heat flow towards the second conducting means, thereby limiting return heat flow through the second coupling means to the heat-sensitive component.

19. The multilayered circuit board of claim 17, wherein the metal-free region is free of metal ground planes but includes metal ground, power, or signal traces.

20. The multilayered circuit board of claim 17, wherein the heat-emitting means is an LED and the heat-sensitive component is a PIR sensor, both installed in a combined smoke detector and carbon monoxide device.

* * * * *